United States Patent [19]
Myer et al.

[11] Patent Number: 6,097,324
[45] Date of Patent: Aug. 1, 2000

[54] METHOD AND APPARATUS FOR EXTENDING THE SPURIOUS FREE DYNAMIC RANGE OF AN ANALOG-TO-DIGITAL CONVERTER

[75] Inventors: Robert Evan Myer, Denville; Mohan Patel, Edison; Jack Chi-Chieh Wen, Parsippany Township, Morris County, all of N.J.

[73] Assignee: Lucent Technologies Inc., Murray Hill, N.J.

[21] Appl. No.: 09/099,882

[22] Filed: Jun. 17, 1998

[51] Int. Cl.[7] .................................................. H03M 1/66
[52] U.S. Cl. ................................................................ 341/118
[58] Field of Search .................................... 341/146, 154, 341/118, 172, 144

[56] References Cited

U.S. PATENT DOCUMENTS

| | | | |
|---|---|---|---|
| 4,408,352 | 10/1983 | Dudding | 455/295 |
| 4,580,105 | 4/1986 | Myer | 330/149 |
| 4,583,049 | 4/1986 | Powell | 330/151 |
| 4,665,560 | 5/1987 | Lange | 455/249 |
| 4,885,551 | 12/1989 | Myer | 330/52 |
| 4,926,136 | 5/1990 | Olver | 330/149 |
| 5,012,490 | 4/1991 | Myer | 375/58 |
| 5,304,945 | 4/1994 | Myer | 330/149 |
| 5,430,893 | 7/1995 | Myer | 455/209 |
| 5,619,168 | 4/1997 | Myer | 330/149 |
| 5,798,724 | 8/1998 | Myers | 341/146 |
| 5,847,603 | 12/1998 | Myer | 330/52 |

FOREIGN PATENT DOCUMENTS

| | | | |
|---|---|---|---|
| 1495264A | 2/1974 | United Kingdom | H03F 1/32 |
| 2296615A | 7/1996 | United Kingdom | H03F 1/32 |
| 2318938A | 5/1997 | United Kingdom | H03F 1/32 |

OTHER PUBLICATIONS

"Expanding Bit Resolution Of An A to D Converter, Dec. 1967." IBM Technical Disclosure Bulletin, vol. 10, No. 7, pp. 919–920, XP002116707, New York, US.

Patent Abstracts of Japan, vol. 015, No. 269 (E1087), Jul. 9, 1991 (1991–07–09) & JP03089627A (Teac Corp), Apr. 15, 1991 (1991–04–15).

Seifert, E. et al.: "Enhancing The Dynamic Range of Analog–To–Digital Converters By Reducing Excess Noise," proceedings of the Pacific Rim Conference on Communications, Computers & Signal Processing, Victoria, Jun. 1–2, 1989, Jun. 1, 1989 (1989–06–01), pp. 574–576, Institute of Electrical & Electronics Engineers.

*Primary Examiner*—Brian Young

[57] ABSTRACT

An A/D system provides an expanded SFDR when compared to the SFDR of individual A/D(s) that make up the A/D system. In response to an analog input signal whose amplitude would result in an narrower SFDR for a first A/D, the A/D system uses an amplitude adjuster which receives the analog input signal and produces an amplitude-limited signal with resulting signal distortion to the first A/D. By amplitude-limiting the analog input signal, the A/D system produces the resulting signal distortion but reduces or "clips" the amplitude of the analog input signal, thereby improving the SFDR performance of the first A/D by reducing the spurious distortion produced by the first A/D. The signal distortion resulting from the amplitude adjustment is routed to a second A/D. The first A/D converts the amplitude-limited analog signal to a digital signal with an expanded SFDR due to the lower amplitude of the adjusted analog signal. The second A/D receives the portion of the analog input signal removed by clipping which can be referred to as the signal distortion. The second A/D converts the signal distortion, which typically has a lower amplitude than the adjusted analog signal, to a digital signal with at least an acceptable SFDR. The A/D system combines the resulting digital signals from the first and second A/Ds to produce the desired converted digital signal with an extended SFDR. The SFDR is extended because the relative difference is increased between the amplitudes of the digital output signal and the spurious distortion when compared to the amplitudes of the digital output signal and the spurious distortion if the analog input signal had been converted by the first A/D without amplitude adjustment.

12 Claims, 1 Drawing Sheet

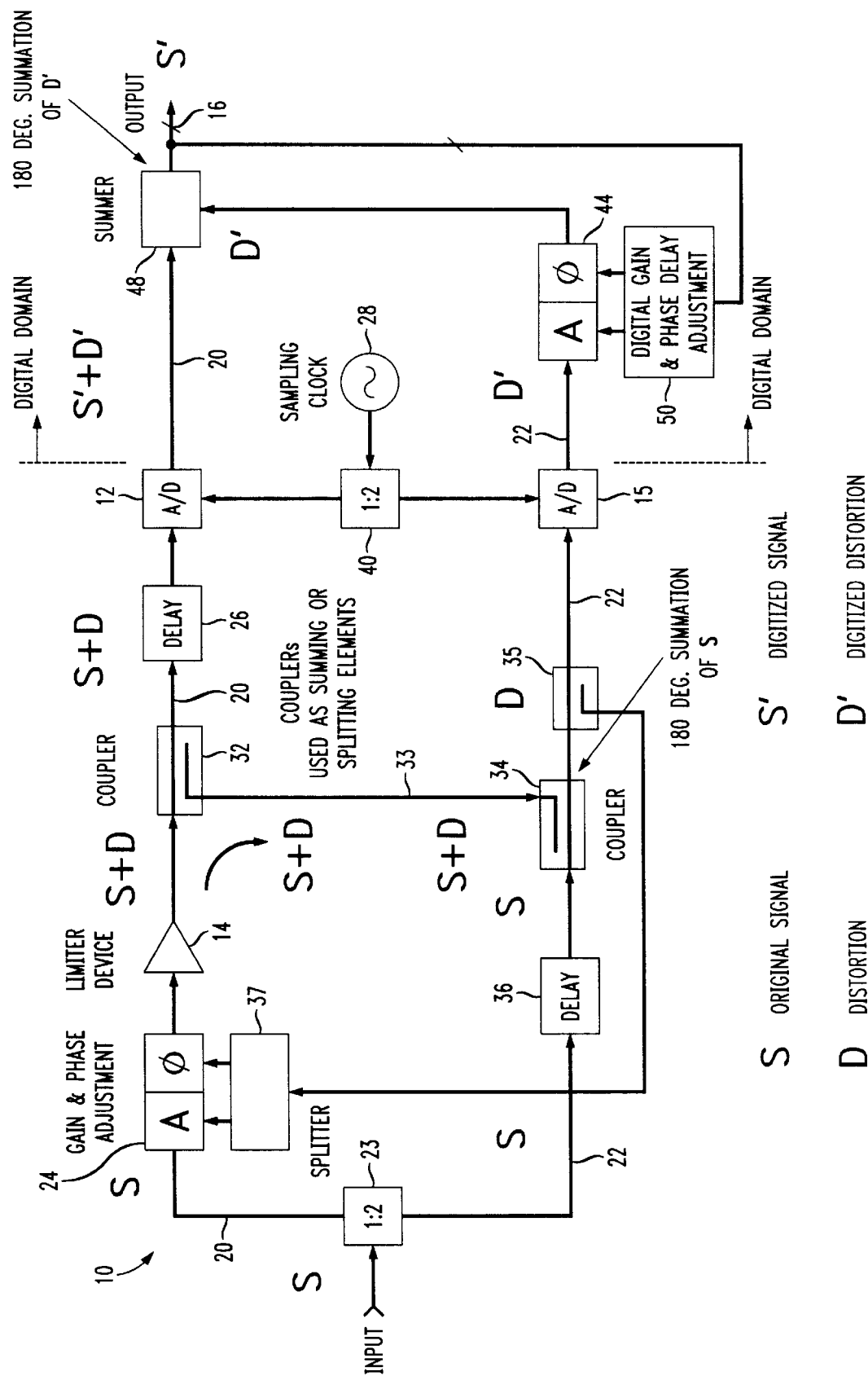

METHOD AND APPARATUS FOR EXTENDING THE SPURIOUS FREE DYNAMIC RANGE OF AN ANALOG-TO-DIGITAL CONVERTER

BACKGROUND OF THE INVENTION

1. Field of The Invention

This invention relates to analog-to-digital converters and, more particularly, to an analog-to-digital converter with an extended spurious free dynamic range (SFDR).

2. Description of Related Art

Many physical devices generate output signals which are analog or continuously varying. Today, signal processing is often accomplished using digital methods. In many applications it is required to convert an analog signal into a digital form suitable for processing by a digital system. Many types of converters exist which act as interfaces between analog devices and digital systems. These converters are used in a variety of applications, including testing, measurement, process control, and communications. Analog-to-Digital (A/D) converters produce a digital output from an analog input. In converting analog signals to digital form, the analog signal is typically sampled then quantized. Nonlinearities in the sampling and quantizing of the analog input signal by the A/D cause spurious distortion, such as intermodulation distortion, of the digitized signal. The amplitude of spurious distortion and the amplitude of the digital output signal can be measured by converting the digital output signal into the frequency domain, for example by using a fast fourier transform.

The spurious free dynamic range (SFDR) of an A/D converter is often measured as the difference in decibels (dBs) between the amplitude or power level of the spurious distortion, such as intermodulation distortion, and the amplitude of the highest output signal. For example, for discussion purposes, a 12 bit A/D can have an SFDR in the 80 dB range defined by a high output level of 4 dBm and a corresponding distortion level of −76 dBm. The SFDR performance of a A/D varies as a function of the amplitude of the analog signal to be converted. Usually, the greater the amplitude of the analog signal, the smaller the SFDR because as the amplitude of the analog input signal increases, the amplitude of the digital output signal increases, but the amplitude of the intermodulation distortion increases more than the amplitude of the digital output signal. Extending the SFDR of the A/D increases the relative difference between the amplitude of the digital output signal and the spurious distortion.

An A/D system with an extended dynamic range is desirable.

SUMMARY OF THE INVENTION

The present invention involves an A/D system which provides an expanded SFDR when compared to the SFDR of an individual A/D(s) that make up the A/D system. For example, in response to an analog input signal whose amplitude would result in an narrower SFDR for a first A/D, the A/D system uses an amplitude adjuster which receives the analog input signal and produces an amplitude-limited signal with resulting signal distortion to the first A/D. Amplitude-limiting the analog input signal produces the resulting signal distortion but reduces the amplitude of the spurious distortion produced from the first A/D by reducing or clipping the amplitude of the analog input signal. The first A/D converts the amplitude-limited analog signal to a converted signal with converted signal distortion. To remove the converted signal distortion, the signal distortion resulting from the amplitude adjustment is routed to a second A/D. The second A/D receives the signal distortion which can be viewed as the portion of the analog input signal removed by clipping, and converts the signal distortion into digital form. The second A/D generates the converted signal distortion with a low level of spurious distortion because the signal distortion typically has an amplitude resulting in a converted signal well within the SFDR of the second AID. The converted signal distortion is fed forward to combine with the converted signal and converted signal distortion from the first A/D to reduce the converted signal distortion and reconstruct the desired converted signal with a lower amplitude of spurious distortion. As such, the A/D system combines the converted signals from the first and second A/Ds to produce the desired converted digital signal with an extended SFDR when compared to the SFDR if the analog input signal had been converted by the first A/D without amplitude adjustment.

BRIEF DESCRIPTION OF THE DRAWINGS

Other aspects and advantages of the present invention may become apparent upon reading the following detailed description and upon reference to the drawings in which:

FIG. 1 shows a general block diagram of an embodiment of the A/D system with extended spurious free dynamic range (SFDR) according to the principles of the present invention.

DETAILED DESCRIPTION

For pedagogic purposes, the invention is described with respect to an exemplary embodiment of the A/D system with an expanded spurious free dynamic range (SFDR). With particular reference to FIG. 1, an A/D system 10 receives an analog signal S which is to be converted into digital form. In this instance, the signal S has an amplitude which would create a narrower SFDR (when compared to the SFDR for the A/D system 10) for a first A/D 12 in that the converting of the signal S by the first A/D 12 would produce a higher level of spurious distortion relative to the amplitude of the converted digital signal S in the frequency domain. Amplitude can be measured in many ways, such as voltage, current, energy, power or intensity, but for discussion purposes, amplitude in the digital domain can refer to the magnitude that the digital signal represents. In the frequency domain, amplitude can refer to power level, and in the time domain, amplitude can refer to voltage level.

The sufficiency of the SFDR is a design choice depending on the particular application. The SFDR is generally is defined by the difference between the amplitude of the digital output signal and the amplitude of the spurious distortion produced therewith. As the amplitude of the analog output signal increases, the difference between the spurious distortion and the output signal generally decreases. A boundary for an acceptable SFDR is generally established by the difference between the highest amplitude of the output signal that results in a typically highest acceptable amplitude for the worst-case spurious distortion. The highest acceptable amplitude for the spurious distortion generally results from the highest output signal level because the level of the spurious distortion generally increases more with increasing output signal amplitude than the corresponding increase in output signal amplitude. As such, the SFDR can be defined for a particular application relative to the highest output signal level and the corresponding spurious distortion. In general, extending the SFDR when compared to the SFDR of a single A/D 12 results if the amplitude of the spurious distortion is reduced for a particular amplitude of the output signal, if the amplitude of the output signal is increased for a given amplitude of spurious distortion, or the relative difference increases between the output signal amplitude and the amplitude of the spurious distortion.

With particular reference to FIG. 1, the AD system 10 receives the analog signal S which is to be converted to digital form. In this instance, the signal S has an amplitude which would create a converted digital signal outside the SFDR of the first A/D 12 in that the converting of the signal S by the first A/D 12 would generate an unacceptable level of spurious distortion. According to the principles of the present invention, a limiting device 14 adjusts or clips the amplitude of the input signal S prior to the first A/D 12, thereby generating the resulting output signal S with an acceptable level of spurious distortion. By adjusting the amplitude of the input signal S, signal distortion D is generated. The signal distortion D can be removed from the output of the A/D system 10 by feeding forward a sample of the signal distortion D.

By "clipping" the input signal S, the limiting device 14 reduces the amplitude of the input signal S by relocating the energy clipped from the input signal S in the form of signal distortion D. The first A/D 12 digitally converts the analog signal S along with the signal distortion D and produces a converted signal S' with converted signal distortion D' in the digital domain. The signal distortion D generated from the limiting device 14 is used to produce a second converted distortion signal D' in the digital domain using a second A/D 15. The SFDR of the second A/D 15 is generally not a problem because the amplitude of the signal distortion D can be designed to be typically smaller than the amplitude-limited signal S. The second digital signal distortion D' is fed forward to combine with the digital signal distortion D' at an output 16 of the A/D system 10 to remove the converted signal distortion D' from the output 16 and produce the desired converted signal S' with a reduced level of spurious distortion. The A/D system 10 combines the digital composite signal S' and D' from the first A/D 12 and the digital signal distortion D' from the second A/D 15, thereby producing the desired converted digital signal S' with an improved SFDR.

By feeding forward the digital distortion energy D', the A/D system 10 is effectively reconstructing the desired digital signal S' using the distortion energy D which was clipped from the signal S prior to conversion into the digital domain. By reconstructing the desired converted signal S', the A/D system 10 produces the desired converted signal S' at an output level which would produce a narrower SFDR for the first A/D 12. The cancellation of the digital signal distortion D' from the output 16 of the A/D system 10 effectively adds digitally converted energy which was clipped from the signal S by the limiting device 14 back into the signal S and the resulting signal distortion D in the digital domain to produce the desired signal S' in the digital domain. In other words, when the signal S is clipped by the limiting device 14, the clipped energy shows up as signal distortion D on a conversion path 20. By isolating the signal distortion D on a second path 22, digitally converting the signals on the paths 20 and 22 in parallel, and adding the digital signal distortion D' back into the conversion path 20, the digital signal S' is being reconstructed. Since the AID system 10 produces the desired signal S' at an amplitude which would be outside the SFDR for the first A/D 12 and with an acceptable level of spurious distortion, the frequency mixer 10 provides an overall extended SFDR.

In FIG. 1, the A/D system 10 according to the principles of the present invention receives the signal S. The signal S is split by a 1:2 splitter 23 onto the conversion path 20 and the second path 22. On the conversion path 20 in this particular embodiment, a gain and phase adjuster 24 adjusts the phase and amplitude of the signal S on the conversion path 20. The phase and amplitude are adjusted to provide improved cancellation of the signal S on the second path 22 using the signal S on the conversion path 20. Typically, phase differences of 175–185 degrees with amplitude differences of 2 dB between the combining signals allow suitable cancellation. The adjustments can be calculated, for example by simply measuring the phase and/or amplitude difference(s) between the combining signals, found in a look-up table based on measurements of the combining signal(s), or made based on measurements of the signal S on the second path 22 after cancellation of the signal S. In some applications, the phase and amplitude adjustments could be relatively constant, or based on measurements of the signal S prior to the adjuster 24.

The limiting device 14 produces an output with an amplitude proportional to the input for output signal levels below or at the "clipping" or adjustment level of the limiting device 14. The adjustment level for the limiting device 14 can be designed to correspond to an upper bound or below the upper bound of inputs to the A/D 12 which produce outputs meeting the SFDR for the first A/D 12. For outputs from the limiting device 14 which would correspond to output levels from the first A/D 12 outside the SFDR of the first A/D 12, the limiting device 14 produces an output at the adjustment level. The limiting device 14 can include an amplifier, diode arrangement, or any other limiting device. The result of the limiting action causes signal distortion D of the signal S that emanates out of the limiting device 14.

The composite signal S and the signal distortion D on the conversion path 20 are delayed by a delay 26 for equalizing the delay experienced by the signal S and D on the conversion path 20 with the delay experienced by the distortion on the second path 22 as discussed below. Depending on the application, the delay 26 need not provide an exact equalization of the two delays, just enough delay such that the corresponding portions of the distortions D' on the conversion path 20 and the distortion D' on the second path 22 can be combined at about 180 degrees out of phase at the output 16. Typically, a delay difference on the order of picoseconds between the delays experienced by the combining signals will allow an acceptable combination of the signals S. Ideally, the signal distortion D' on the conversion path 20 and the signal distortion D' on the second path 22 are combined at about 180 degrees out of phase, but depending on the application, the signal distortions D' can be more or less than 180 degrees out of phase, for example a phase difference of 175–185 degrees.

In this particular embodiment, the signal S and the signal distortion D are provided to the A/D 12, and the signal S and signal distortion D are sampled by the A/D 12 according to a continuous wave signal generated from the oscillator 28. In other applications, the signal S can be a signal having a varying frequency. In this application, the A/D 12 converts the signal S and the signal distortion D to digital form using the continuous wave signal from an oscillator 28 to establish the sampling speed. The digital conversion produces digital signals S' and D' with amplitudes reflecting the amplitude characteristics of S and D. The digital conversion also produces other undesired spurious distortion especially at higher output signal amplitudes and sampling speeds. Because the signal S on the conversion path 20 was adjusted so that the resulting converted signal S' is within the SFDR of the A/D 12, the conversion process does not generate unacceptable levels of spurious distortion.

The desired converted signal S' is obtained at the output 16 of the A/D system 10 by adding the converted signal distortion D' on the second path 22 back into the conversion path 20 after the A/D 12. To do so, the signal distortion D is isolated on the second path 22. In this particular embodiment, a coupler 32 couples the composite signal S and D from the conversion path 20 to a coupling path 33, and a coupler 34 couples the composite signal S and D onto the second path 22. The signal S is amplitude and phase adjusted by the adjuster 24 as well as by the other components to be about 180 degrees out of phase and having about the same amplitude as the signal S already on the second path 22 to reduce the signal S from the second path 22. Depending on the application, the phase difference between the signals S need not be exactly 180 degrees. For example, the phase difference between the signals could be from 175–185 degrees, and the amplitude difference could be 2 dB. The signal S coupled from the conversion path 20 combines with the signal S on the second path 22, leaving the signal distortion D coupled from the conversion path 20 as the prominent signal on the distortion path 20. In certain embodiments, a coupler 35 provides a portion of the output of the coupler 34 to control circuitry 37. The control circuitry 37 provides phase and amplitude adjustment signals to the phase and amplitude adjusters 24 to improve the cancellation of the signal S from the second path 22 at the coupler 34. In any event, the adjuster 24, limiting device 14 and the couplers 32 and 34 are designed to reduce the signal S at the output of the coupler 34 to make the signal distortion D the prominent signal on the second path 22. This can be accomplished with or without the coupler 35 and control circuitry 37 depending on the desired application.

On the second path 22, a delay 36 equalizes the delay difference between the second path 22 and the conversion path 20 to the coupler 34 caused primarily by the gain and phase adjuster 24 and the limiting device 14 in this embodiment. Depending on the application, the delay 36 need not provide an exact equalization of the two delays, just enough delay (for example, on the order of picoseconds) such that the corresponding portions of the signal S on the conversion path 20 and the signal S already on the second path 22 can be combined in a manner that reduces the signal S on the second path 22. As such, the signal S on the second path 22 is reduced at the output of the coupler 34, leaving the signal distortion D as the prominent signal on the second path 22.

The couplers 32 and 34 are used as splitting and summing elements, respectively. The couplers 32 and 34 produce less loss on the main path (the conversion path 20 and the second path 22 respectively) than the 3 dB of loss that would be produced by conventional 3 dB summers or splitters which produce 3 dB of loss on both legs of the split or summation. In this particular embodiment, the couplers 32 and 34 produce low loss (for example, 0.5 dB respectively) on the conversion path 20 and the second path 22, respectively (which provides a reduced noise figure). The couplers 32 and 34 attenuate (for example, 10–20 dB respectively) the signals S and D split onto the coupling path 33 and summed into the second path 22.

The signal distortion D on the second path 22 is then analog-to-digitally converted using a second A/D 15 using a sampling speed established by the sampling signal from the oscillator 28. In this particular embodiment, a 1:2 splitter 40 is coupled to the oscillator 28 and provides the same sampling signal to both the first A/D 12 and the second A/D 15. Providing the same local oscillator signal to the first and second A/D 12 and 15 is done to reduce any small variations which could be introduced in the parallel analog-to-digital conversion and detrimentally effect the combining of the signals at the output 16. Along those lines, the first and second A/Ds 12 and 15 could be the same types of A/Ds, but depending on the application, different types of A/Ds can be used which receive signals from different sources.

The converted signal distortion D' on the second path 22 path passes through an digital amplitude and phase delay adjuster 44 which adjusts the amplitude and phase of the converted signal distortion D'. The amplitude and phase of the converted distortion D' are adjusted taking the operating parameters of the design components into consideration to reduce the converted distortion D' at the output 16 of the A/D system 10, thereby leaving the desired converted signal S' as the prominent signal with an acceptable level of spurious distortion, such as intermodulation distortion. Depending on the design parameters, the robustness of the design, and the particular application, different components could be used or components removed from the design.

Generally, the amplitudes of the converted signal distortions D' need not exactly match. If the amplitudes of the converted distortions D' are the same, and the converted distortions D' have a 180 degree phase difference, complete cancellation can be achieved. As mentioned above, such a result is generally not necessary in not only reducing the converted distortion D' at the output 16 but also in reducing the signal S from the second path 22. To equalize the delay of the conversion path 20 with the delay on the second path 22 primarily associated with the amplitude and phase adjuster 44, the delay 26 delays the signal S and the distortion D on the conversion path 20. The converted distortion D' on the second path 22 is added to the conversion path 20 using a summer 48. The delay 26 need not exactly equalize the delays (for example, depending on the application, delay differences on the order of picoseconds are acceptable) of both paths 20 and 22, but the respective delays should be close enough that the corresponding portions of the distortion D' on the conversion path 20 and the distortion D' on the second path 22 can be combined at about 180 degrees out of phase. Ideally, the signal distortion D' on the first path 20 and the signal distortion D*' on the second path 22 are combined at about 180 degrees out of phase, but depending on the application, the distortions D' can be more or less than 180 degrees out of phase, for example 175–185 degrees out of phase. The converted signal distortion D' from the second path 22 combines with the converted signal distortion D' on the conversion path 20 to produce the desired converted signal S'.

In certain embodiments, control circuitry 50 obtains the desired converted signal S' from the output 16. The control circuitry 50 provides amplitude and phase adjustment signals to the amplitude and phase adjuster 44 to improve removal of the converted signal distortion D' from the output 16. The control circuitry 50 can measure the amplitude of the converted distortion D' remaining in the output signal S' using a fourier transform and in response to those measurements provide phase and amplitude adjustment signals to the phase and amplitude adjuster 44. The phase and amplitude adjuster 44 responds to the phase and amplitude adjustment signals by adjusting the phase and amplitude of the converted distortion D*' to fine tune the reduction of the distortion D' from the output signal S'. The adjustment can be calculated by simply measuring the amplitude and/or phase difference between the combining signals, by using a look-up table based on measurements of the signal(s), such as measurements of the amplitude of the converted distortion D*' at the output of the A/D system 10. In some applications, the phase and amplitude adjustments could be relatively constant, or based on measurements of the distortion D' prior to the adjuster 44 and/or signal D' prior to the summer 48.

In addition to the embodiment described above, alternative configurations of the A/D system according to the principles of the present invention are possible which omit and/or add components and/or use variations or portions of the described system. The amount of amplitude difference, phase difference and delay difference which is tolerated between combining signals depends on the particular application and the corresponding tolerance permitted by the application. These operating design parameters also can determine which components can be added, changed or omitted. For example, the splitter 23 could be implemented by couplers or other devices. If a coupler is used, then a linear amplifier could be included on the path connected to the leg of the coupler with the higher loss. Additionally, the delays 26 and 36 can be implemented using passive devices, such as a passive filter, transmission line (coax, microstrip, or stripline), or active devices, such as amplifiers, active filters, digital delays or fiber, but active devices do introduce distortion. Alternatively, the phase and amplitude adjuster 42 along with the gain and phase control circuitry 46 can be located on the first path 16, and the delay 48 can be located on the second path 18.

As would be understood by one of ordinary skill in the art, the various components making up the A/D system and their respective operating parameters and characteristics, such as loss, should be properly considered in designing the A/D system. For example, the A/Ds can be the same type of A/Ds, but different types of A/Ds could be used. The SFDR as well as other operating parameters for the A/Ds should be considered in determining the adjustment level for the digital input signal. Depending on the various components of the A/D system, the SFDR can be changed. For example, by choosing two A/Ds with the same SFDR, the SFDR of the A/D system can be theoretically doubled because a digital input signal resulting in an output signal with twice the amplitude of the highest output signal defining the SFDR of one of the A/Ds could be clipped in half to produce a second signal having an amplitude at the highest output signal level defining the SFDR for the second A/D. As such, the clipped signal is provided to the first A/D, and the portion of the signal clipped from the input signal S is put on a second path with the second A/D. The converted clipped signal and the converted portion clipped from the signal S can then be combined at the output of the A/D system to have twice the amplitude of the highest output signal level defining the SFDR of each DAC, thereby the providing about twice the SFDR.

Alternatively, an A/D or A/Ds with lower and/or different SFDRs could be used to provide a desired extended SFDR at lower cost. The extended SFDR could result from increasing the amplitude of output signal of the A/D system while maintaining or providing less of an increase in the corresponding spurious distortion level, or from reducing the amplitude of the spurious distortion while maintaining or providing less of an increase in the amplitude of the output signal. Additionally, the A/D system has been described as improving the SFDR relative to the amplitudes of the output signal and the spurious distortion for signals having an amplitude outside the SFDR for the first A/D. A particular SFDR for an A/D is determined by the operating characteristics of an A/D and depends on the requirements for a particular application. The A/D system uses the A/D with the particular SFDR and provides an extended spurious free dynamic range, thereby increasing the relative difference between the amplitudes of the high output signal and the corresponding spurious distortion. For discussion purposes, the A/D system has been described with reference to the input signal S and a clipped signal S with resulting signal distortion D on the first path 20. On the second path 22, the input signal S is described as being combined with the clipped or composite signal S and D to isolate the signal distortion on the second path 22. It should be understood that different notations, references and characterizations of the various signals can be used. The designations above were chosen to simplify the explanation of the invention.

Furthermore, the A/D system has been described using a particular configuration of distinct components, but it should be understood that the A/D system and portions thereof can be implemented in application specific integrated circuits, software-driven processing circuitry, firmware or other arrangements of discrete components as would be understood by one of ordinary skill in the art with the benefit of this disclosure. Although in the illustrative embodiment is shown with a particular circuitry, the A/D system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of converting an analog signal to digital form, said analog signal having an amplitude which would produce a converted digital signal and spurious distortion defining a spurious free dynamic range for a analog to digital converter (A/D) on a first path, said method comprising the steps of:

clipping the amplitude of said analog signal to be converted on said first path to an amplitude resulting in a converted signal with spurious distortion defining a wider spurious free dynamic range for said A/D; and converting by said A/D said adjusted analog signal on said first path into digital form to produce a converted signal with spurious distortion defining a wider spurious free dynamic range.

2. The method of claim 1 including the steps of:

routing said analog signal onto said first path and a second path;

obtaining said clipped analog signal and signal distortion created by said step of clipping from said first path; and combining said clipped analog signal and said signal distortion obtained from said first path with said analog signal on said second path to reduce said analog signal on said second path and produce said signal distortion on said second path.

3. The method of claim 2 further including the step of:

combining said signal distortion on said second path with said signal distortion on said first path.

4. The method of claim 3 further including the step of:

converting said signal distortion on said first path to digital form to produce converted distortion on said first path;

converting said signal distortion on said second path to digital form to produce converted distortion on said second path; and combining said converted distortion on said second path with said converted distortion on said first path.

5. The methods of claim 4 wherein said steps of converting further including the step of:

using a sampling signal having a certain frequency for said steps of converting.

6. The methods of claim 4 further including the step of:

equalizing the delays on said first and second paths.

7. The method of claim 4 further including the step of:

adjusting the relative amplitude and phase difference between said converted signal and said converted distortion on said first path and said converted distortion on said second path.

8. A analog to digital converter (A/D) system for converting an analog input signal to digital form, said analog signal having an amplitude which would produce a converted digital signal and spurious distortion defining a spurious free dynamic range for a analog to digital converter (A/D) on a first path, said A/D system comprising:

a clipper receives said analog input signal and clips the amplitude of said analog input signal to an amplitude which results in a converted signal with spurious distortion defining a wider spurious free dynamic range for said A/D and to produce a clipped analog signal and signal distortion on said first path and signal distortion on a second path;

said first A/D on said first path receives said clipped analog signal and said signal distortion on said first path and converts said clipped analog signal and said signal distortion on said first path into digital form to produce a converted signal with spurious distortion defining a wider spurious free dynamic range.

9. The system of claim 8 further comprising:

said first A/D on said first path converts said clipped analog signal and said signal distortion on said first path to digital form to produce a converted signal and converted distortion;

a second A/D on said second path converts said signal distortion on said second path into digital form to produce converted distortion on said second path; and a combiner connected to said first and second paths and combines said converted signal and said converted distortion from said first path with said converted distortion on said second path to produce a desired converted signal.

10. The apparatus of claim 9 further comprising:

a second A/D on said second path receives said signal distortion on said second path and converts said signal distortion to digital form to produce converted distortion on said second path; and a combining device connected to said first and second paths to combine said converted signal and said converted distortion on said first path and said converted distortion on said second path to produce a desired converted signal.

11. A method of converting an analog signal to digital form, said method comprising the steps of:

providing an analog signal to be converted on a first path and a second path;

clipping the amplitude of said analog signal to be converted on said first path to produce an analog signal and signal distortion;

combining said analog signal and said signal distortion obtained from said first path with said analog signal on said second path to reduce said analog signal on said second path and isolate said signal distortion on said second path and converting by a first A/D on said first path said analog signal and said signal distortion on said first path into digital form to produce a converted signal and converted distortion on said first path;

converting said signal distortion on said second path to digital form to produce converted distortion on said second path; and combining said converted distortion on said second path with said converted distortion on said first path.

12. A analog to digital converter (A/D) system for converting an analog input signal to digital form, said A/D system comprising:

a clipper receives said analog input signal and clips the amplitude of said analog input signal to produce a clipped analog signal and signal distortion on said first path and signal distortion on a second path;

said first A/D on said first path receives said analog signal and said signal distortion on said first path and converts said clipped analog signal and said signal distortion on said first path into digital form to produce a converted signal and converted distortion on said first path;

a second A/D on said second path converts said signal distortion on said second path into digital form to produce converted distortion on said second path; and a combiner connected to said first and second paths and combines said converted signal and said converted distortion from said first path with said converted distortion on said second path to produce a desired converted signal.

\* \* \* \* \*